United States Patent
Hoffmeister et al.

(10) Patent No.: US 11,108,365 B2
(45) Date of Patent: Aug. 31, 2021

(54) CLASS-D AMPLIFIER AND OPERATING METHOD

(71) Applicant: Robert Bosch GmbH, Stuttgart (DE)

(72) Inventors: Fabian Hoffmeister, Schoenau (DE); Gregor Sauer, Straubing (DE); Josef Plager, Bogen (DE); Markus Mandl, Steinach Agendorf (DE); Thomas Stein, Wald (DE); Patrick Engl, Rattiszell (DE)

(73) Assignee: Robert Bosch GmbH, Stuttgart (DE)

( * ) Notice: Subject to any disclaimer, the term of this patent is extended or adjusted under 35 U.S.C. 154(b) by 44 days.

(21) Appl. No.: 16/617,040

(22) PCT Filed: Apr. 11, 2018

(86) PCT No.: PCT/EP2018/059233
§ 371 (c)(1),
(2) Date: Nov. 26, 2019

(87) PCT Pub. No.: WO2018/219537
PCT Pub. Date: Dec. 6, 2018

(65) Prior Publication Data
US 2021/0135638 A1 May 6, 2021

(30) Foreign Application Priority Data

May 30, 2017 (DE) ...................... 10 2017 209 067.7

(51) Int. Cl.
*H03F 1/30* (2006.01)
*H03F 3/217* (2006.01)
*H03F 1/02* (2006.01)

(52) U.S. Cl.
CPC ......... *H03F 3/2173* (2013.01); *H03F 1/0227* (2013.01); *H03F 2200/03* (2013.01)

(58) Field of Classification Search
CPC .................................... H03F 1/30; H03G 3/20
(Continued)

(56) References Cited

U.S. PATENT DOCUMENTS 5,892,404 A 4/1999 Tang
9,362,875 B2 * 6/2016 Blyth ...................... H03F 3/183
(Continued)

FOREIGN PATENT DOCUMENTS

DE 102012200524 7/2013
EP 1317105 A1 6/2003
(Continued)

OTHER PUBLICATIONS

International Search Report for Application No. PCT/EP2018/059233 dated Jun. 26, 2018 (English Translation, 3 pages).

*Primary Examiner* — Henry Choe
(74) *Attorney, Agent, or Firm* — Michael Best & Friedrich LLP (57) ABSTRACT

The invention relates to a method for operating a class-D amplifier (2) for an audio signal (4), which class-D amplifier contains an output stage (10) and a signal-processing unit (12) in a signal path (6), wherein a voltage (U) of at least two magnitudes (U1, U2) is provided for the output stage (10), a voltage requirement (B) of the output stage (10) for the audio signal (4) is predictively determined from the audio signal (4) at a measurement location (14) before the signal-processing unit (12), a magnitude (U1, U2) that is minimally sufficient for the voltage requirement (B) is selected on the basis of the voltage requirement (B) and said magnitude is applied to the output stage (10) before the amplification. A class-D amplifier (2) for an audio signal (4), having a signal path (6), which has an output stage (10) and a signal-processing unit (12), contains a voltage source (16) for the output stage (10) having a voltage (U) of at least two magnitudes (U1, U2), a measurement location (14) before (Continued)

the signal-processing unit (12), and a control and evaluation unit (18) for predictively determining a voltage requirement (B) for the output stage (10) for the proper amplification of the audio signal (4) from the audio signal (4) at the measurement location (14), wherein the control and evaluation unit (18) selects a magnitude (U1, U2) that is minimally sufficient for the voltage requirement (B) on the basis of the voltage requirement (B) and applies said magnitude to the output stage (10) before the amplification.

15 Claims, 3 Drawing Sheets

(58) Field of Classification Search
USPC .................................. 330/129, 297, 136
See application file for complete search history.

(56) References Cited

U.S. PATENT DOCUMENTS

| | | |
|---|---|---|
| 2010/0141345 A1 | 6/2010 | Nabicht |
| 2013/0034250 A1 | 2/2013 | Ozaki et al. |
| 2014/0270242 A1 | 9/2014 | Cheung et al. |
| 2014/0361831 A1 | 12/2014 | Hoffmeister |
| 2015/0030183 A1 | 1/2015 | Pazhayaveetil et al. |
| 2017/0104462 A1 | 4/2017 | Frith et al. |

FOREIGN PATENT DOCUMENTS

| | | |
|---|---|---|
| EP | 2264889 | 12/2010 |
| EP | 2432119 | 3/2012 |
| EP | 2819303 A1 | 12/2014 |

\* cited by examiner

CLASS-D AMPLIFIER AND OPERATING METHOD

BACKGROUND OF THE INVENTION

DE 10 2012 200 524 A1 discloses, among the amplifier types, so-called class-D amplifiers which first of all use a pulse-width modulator to convert an analog signal into a pulse-width-modulated switching signal which is then amplified and is subsequently converted back into a continuously variable voltage using a filter. Amplifiers of this type are particularly energy-efficient and are therefore preferably used in high-power amplifiers. Said document proposes an amplifier apparatus having a control device, wherein the control device has an input interface for an audio signal, having an amplifier device which is connected downstream of the control device and is intended to amplify the audio signal, wherein the control device has a delay module, wherein the delay module is designed to forward the audio signal to the amplifier device in a manner delayed by a delay value and, in an adaptation phase, to reduce the delay value automatically from a starting value to a final value.

The awareness of saving energy has also reached professional audio technology.

SUMMARY OF THE INVENTION

Within the scope of the invention, a method for operating a class-D amplifier is disclosed. The amplifier is used to amplify an audio signal. The amplifier contains a signal path for the audio signal, on which the audio signal is passed through the amplifier and amplified. The amplifier contains an output stage in the signal path. The amplifier contains a digital signal processing unit in the signal path. Said signal processing unit is arranged upstream of the output stage in the signal path.

In the method, a voltage for supplying power to the output stage is provided. In this case, the voltage is provided in such a manner that the voltage may have at least two different magnitudes or voltage values (in particular absolute values). A measurement location exists upstream of the signal processing unit in the signal path. At this measurement location, a voltage requirement of the output stage is predictively determined from the audio signal, that is to say the audio signal at the measurement location or that period of the audio signal which is present at the measurement location at the measurement time (first time) is evaluated for this purpose. The voltage requirement is necessary for the subsequent proper amplification of the audio signal present or evaluated at the measurement location in the output stage. That evaluated signal section therefore only arrives at the output stage at a subsequent, second time. Within the scope of desired specifications, "proper" means without interference, for example without or only with maximum permissible distortion, artefacts, popping noises etc.

In the method, one of the available magnitudes of the voltage is also selected. This is carried out by following the predictively determined voltage requirement. The respective magnitude is selected in such a manner that it is minimally sufficient for the voltage requirement. The voltage of the corresponding magnitude is applied to the output stage at a time before the time at which the audio signal is amplified (second time), that is to say between the first time and the second time. In this case, the signal processing unit has an operating time. The operating time is the time difference between a signal or a particular signal point or signal section passing through at the measurement location (first time) and the subsequent amplification of this signal section or signal point in the output stage (second time). The determination of the voltage requirement is therefore predictive with respect to this operating time.

"Before the time" should be understood as meaning the fact that the voltage of the magnitude needed for the voltage requirement is available "in good time beforehand" at the output stage before the output stage requires the corresponding power from the voltage at the second time for the purpose of actually amplifying the corresponding signal or signal section.

According to the invention, it is ensured that, in the event of an increase in the power requirement in the output stage, sufficiently high voltage is available in good time at the output stage for the purpose of amplifying the audio signal without artefacts. At the same time, it is possible to operate with accordingly lower voltages as long as a corresponding power does not become necessary. As soon as the voltage requirement falls below a particular magnitude again, the method switches back to the next lower magnitude.

In other words, the output stage is therefore always operated with the lowest possible voltage as long as the voltage requirement does not exceed the lowest voltage. Otherwise, the method changes over continuously, for example as slowly as possible, to the next higher voltage. "Continuously" essentially means in a ramp-like manner. If more than two voltages are held, the method respectively switches up to the n+1th magnitude of the voltage or switches back to the next lower voltage if the nth magnitude of the voltage is exceeded.

In one preferred embodiment, the voltage at the output stage is increased and/or reduced between the different magnitudes with a maximum edge steepness of 5 volts per microsecond or 3 volts per microsecond or 1 volt per microsecond or 0.5 volt per microsecond or 0.25 volt per microsecond or 0.1 volt per microsecond. In other words, the edge steepness for a voltage rise or a voltage drop at the output stage is limited to corresponding maximum values. In the case of an accordingly low edge steepness, it can therefore be ensured that the class-D amplifier can follow the respective voltage change in its supply voltage without artefacts without exhibiting, for example, distortion, interference or other undesirable effects.

In one preferred embodiment, the edge steepness is selected in such a manner that a time difference between the predictive determination of the voltage requirement (time at which the audio signal is analyzed at the measurement location or the voltage requirement is determined therefrom, first time) and its subsequent amplification in the output stage (second time) just suffices for the change in the magnitude of the voltage. In other words, the voltage is therefore effected as slowly as possible starting from an instantaneous value to the target value so slowly that the voltage with the corresponding magnitude according to the voltage requirement is available just in good time at the output stage for the purpose of amplifying the corresponding section of the audio signal. The edge steepness can be reduced as far as possible, which further improves the audio properties of the class-D amplifier. Computing times for calculating the voltage requirement after tapping off the audio signal at the measurement location are possibly disregarded. Otherwise, the change in the voltage is started from the time at which the (still future) voltage requirement was determined.

In one preferred embodiment, for each magnitude of the voltage, a separate or individual fixed voltage of this magnitude is permanently held. The actual voltage is then generated by continuously changing over between the fixed voltages in each case. "Continuously" means that the changeover is not carried out suddenly but rather in a controlled manner with a finite edge steepness, in particular according to the above. The number of available fixed voltages is therefore oriented to the number of different magnitudes of the voltage which are held according to the method.

In particular, (bipolar) voltages of two different magnitudes, for example +/−165 volts and +/−20 volts, are provided according to the method. Two fixed voltages, namely 230 volts and 40 volts, are therefore also held in order to generate the respective bipolar voltages of the fixed magnitudes.

A class-D amplifier is also disclosed within the scope of the invention. The amplifier is used to amplify an audio signal. The amplifier contains a signal path for conducting and amplifying the audio signal. The amplifier contains an output stage and a digital signal processing unit arranged upstream of the output stage in the signal path. The amplifier contains a voltage source for supplying power to the output stage with a voltage, wherein this voltage—as explained above—can have at least two different magnitudes. The amplifier contains a measurement location arranged upstream of the signal processing unit in the signal path.

The amplifier contains a control and evaluation unit. The latter is used for the predictive determination of a voltage requirement from the audio signal at the measurement location, as explained above, wherein the voltage requirement is the voltage requirement subsequently required in the output stage for the subsequent proper amplification of the audio signal in the output stage.

The control and evaluation unit is also set up to select a respective magnitude of the voltage in a manner following the predictively determined voltage requirement, which magnitude is minimally sufficient for the voltage requirement, and to apply said magnitude to the output stage before the time at which the audio signal is amplified in the output stage. The amplifier and at least some of its embodiments and the respective advantages have already been analogously explained in connection with the method according to the invention.

In one preferred embodiment, the signal processing unit contains a digital/analog converter (DAC). In particular, the signal processing unit is the digital/analog converter. A corresponding DAC generally has an operating time or latency of several hundred microseconds. The corresponding time delay already suffices to analyze the audio signal at the measurement location upstream of the DAC with respect to its power requirement in the amplifier according to the method mentioned above and to accordingly adapt the voltage at the amplifier in good time. In addition, a high-quality prediction of the power requirement in the output stage can be carried out at a measurement location directly upstream of the DAC since the signal as such (only in digital rather than analog form) is already fixed. The DAC therefore provides a suitable region or location for using the method according to the invention in the amplifier.

In one preferred variant of this embodiment, the signal processing unit contains a level controller arranged upstream of the DAC. In particular, the signal processing unit is the combination of the level controller and the downstream DAC. A corresponding level controller also again contains a certain delay time. This provides even more temporal leeway to carry out an even slower voltage adaptation at the output stage. Nevertheless, a high-quality prediction of the power requirement can also be carried out at a measurement location upstream of the level controller.

In one preferred embodiment, the voltage source has an output for the voltage. The voltage source also has a fixed voltage input for each magnitude of the voltage. The voltage source contains at least one continuously switchable switching element in order to selectively connect different fixed voltage inputs, that is to say at least one, in particular a single one of the fixed voltage inputs, to the output. The switching element may be a single component, or else a circuit arrangement, for example a switching element and a diode.

In such a voltage source, the different voltage magnitudes can be provided in a particularly simple manner and it is also possible to continuously change over between these magnitudes in a particularly simple manner without producing voltage jumps. As a result of the continuously switchable switching element, it is possible to carry out any desired fast or slow ramp operations—as explained above—for changing over between the voltages of different magnitudes. The switching element is, in particular, a field effect transistor (FET). A continuous changeover in the form of a voltage ramp is therefore carried out.

In one preferred variant of this embodiment, the voltage source is a bipolar voltage source, that is to say it provides two potentials of +/−X volts in each case. The output and each fixed voltage input therefore respectively have two poles. The voltage source contains at least one switching element for each pole of the output. The above-mentioned advantages of simple provision and smooth changeover between the voltages of different magnitudes can therefore also be achieved for bipolar voltage sources.

In one preferred embodiment, the voltage source contains buffer capacitors for the voltage U only on those sides of the fixed voltage inputs which are remote from the output. Since the fixed voltages are always permanently held, these buffer capacitors are permanently charged and their charge is not reversed in any case by switching operations caused by the switching elements. In this case, each of the buffer capacitors is assigned to a respective fixed voltage. In other words, the voltage source is designed without buffer capacitors in the direction of the output. If the voltage is changed over between different magnitudes, the charge of no buffer capacitors whatsoever must be reversed, which results in a particularly uniform mains-side or input-side performance of the amplifier. In the event of a changeover between different voltages, no load jumps can therefore be expected on the input side, for example on the mains side, at the input of the amplifier.

In one preferred embodiment of the method according to the invention, the method is carried out with the aid of the amplifier according to the invention.

In one preferred embodiment of the amplifier, the latter is designed to carry out the method according to the invention.

The invention is based on the following knowledge, observations and considerations and also has the following embodiments. In this case, the embodiments are also partly called "the invention" in a simplifying manner. In this case, the embodiments may also contain parts or combinations of the embodiments mentioned above or may correspond to the latter and/or may possibly also include embodiments which have not been previously mentioned.

The invention is based on the following considerations:

In a professional audio system, for example of the size for an average football stadium, roughly over 90% of the energy costs are caused by partial operation and no-load operation in the case of a conventional usage profile (5 hours per week of full operation, 7×5 hours/week of partial operation at 10%). Solely the no-load operation of the output stages therefore causes over 66% of the electricity costs. In order to reduce the operating costs of the amplifiers, the power consumption, in particular, must therefore be reduced in the case of light use and at no load. This knowledge is not novel in principle. Various solutions which reduce the energy requirement in these operating modes are available on the market. However, these solutions in most cases entail restrictions which are briefly shown below.

The pursuit of the highest possible efficiency of an audio amplifier is as old as the development of electronic audio amplifiers. In recent decades, the emergence of class-D amplifiers, in particular, has considerably improved the efficiency of audio amplifiers. However, there are a multiplicity of versions with different efficiencies even in this type of amplifier. Various combinations of class-D with class-AB amplifiers are becoming more or less promising. A good overview of the prior art is provided by the thesis "'HIGH EFFICIENCY AUDIO POWER AMPLIFIERS design and practical use', Ronan van der Zee, University of Twente, 21 May 1999".

As mentioned above, the efficiency of an amplifier during rated operation is not decisive at all for the energy costs in many cases, but rather the power loss during no-load or light operation. Irrespective of the operating mode, all audio amplifiers have in common the fact that the power loss at no load/in light use depends on the internal operating voltage. The higher the operating voltage, the higher the power loss. Depending on the amplifier type, the relationship varies from linear to quadratic.

For this reason, it is desirable, according to considerations according to the invention, to reduce the operating voltage at no load and in the case of light load. A widespread topology in the field of linear amplifiers is the class-H output stage which changes over between two or more staggered operating voltages. In the case of light load, the amplifier runs at the lowest operating voltage and thereby reduces the power consumption. This basic principle of operating voltage modulation can be applied, in principle, to modern switching amplifiers (class-D). However, some principle-dependent difficulties with associated disadvantages occur here:

In contrast to linear amplifiers, a switching amplifier does not have any intrinsic operating voltage suppression. Each change in the operating voltage must be compensated for by means of the negative feedback so that the operating voltage change does not disrupt the amplifier output as interference. As a result of the finite efficiency of the negative feedback, a hard changeover of the operating voltage results in more or less audible interference at the changeover moment at the amplifier output. At the same time, on account of the charge reversal of buffer capacitors, a hard changeover of the operating voltage often results in current surges on the mains supply of the amplifiers, which can result in the mains fuse being tripped, in particular if a plurality of devices are operated at the same time.

A solution to this problem in switching amplifiers would be a comparatively slow ramping-up of the internal operating voltage. One possible implementation is a regulated power supply unit. At no load or in the case of light use, the power supply unit provides the amplifier stage with a low supply voltage. As soon as the output voltage increases, the power supply unit increases the internal operating voltage. In practice, this results in a compromise which cannot be overcome: if the supply voltage is ramped up very slowly, the negative feedback of the amplifier can indeed limit interference at the output to an acceptable level. At the same time, the briefly increased power consumption on the mains supply can be limited to a tolerable extent. However, the great disadvantage of this method is that the supply voltage cannot be ramped up quickly enough in the event of sudden full modulation of the amplifier. As a result, the amplifier output voltage will not follow the amplifier input voltage for some time and non-linear distortion, which may be audibly interfering, inevitably results at the amplifier output. This can be counteracted by virtue of the power supply unit ramping up the operating voltage more quickly, which in turn provokes the problems described above as a result of the rapid change in the level of the operating voltage.

As mentioned above, the losses in the low-load and no-load operation of an audio amplifier are substantially dependent on the operating voltage of the power section. The concept of the invention involves selecting the operating voltage of the amplifier blocks on the basis of the instantaneous operating point.

If only a low output level is applied (background music, pilot tone, etc.), the amplifier switches to a low voltage supply (for example referred to as "low rail").

If the output level now increases above a certain threshold, a "RAIL_UP" signal is set and the amplifier is consequently supplied with the full supply voltage ("high rail").

Depending on the application and electrical design, the operation of changing over the operating voltage can be carried out frequently or rarely.

Another concept of the invention is the following:
a. When switching up the supply voltage, the charge of no buffer capacitors is reversed and, as a result, no current surge is produced on the mains supply either. The switching-up is carried out sufficiently slowly in this case, with the result that no audible artefacts occur at the switching-up moment at the output stage output.
b. Time saving for the switching-up by predicting the output voltage: so that point a functions, it is necessary for the switching-up signal to be able to be generated sufficiently early. Conventionally, such a signal is generated by comparing the output stage output voltage with a limit value. However, precisely the problem of the internal operating voltages having to be switched up virtually immediately then exists, which results in the problems explained above.

The invention now follows the path of using the predicted output voltage as the comparison signal.

The present invention discloses a novel method which massively reduces the energy requirement of power amplifiers at light load and no load. As a result of this method, there are no restrictions whatsoever for the application and the customer during operation. Since the invention can be implemented solely in the output stage, no preliminary work needs to be carried out at the system level either.

The present invention is an implementation for energy-saving operation of audio amplifiers at no load and in the case of light use without entailing disadvantages:

In the case of light use and at no load, the amplifier stages are operated at a lower operating voltage. For example, the regular operating voltage is reduced from +/−165 V to +/−20 V in the case of light use and at no load. In this example, the power loss of an amplifier channel is reduced by 80%. The power loss of an entire power amplifier can be more than halved at no load by using the present invention.

A solution which, when switching up the internal supply voltage, does not increase the mains power supply at the switching-up moment is shown.

A solution which does not result in any audible artefacts at the amplifier output at the switching-up moment is shown.

The solution operates autonomously. That is to say, the energy-saving function is carried out in a fully automatic manner by the amplifier; neither the customer nor the system must carry out any preliminary work or adjustments etc.

The amplifier is functional without restriction during energy-saving operation.

The described invention can be generalized in the following points:

In the case of multichannel amplifiers, the operating voltage can be ramped up either in a channel-by-channel manner, for a group of channels or for all channels at the same time.

The invention is described using the example of a class-D amplifier with a bipolar supply voltage. However, the invention can also be applied without any problems to amplifier concepts with unipolar supply voltages.

For reasons of clarity, the invention is described using the example of a class-D half-bridge. The invention can also be applied to full-bridge topologies.

Likewise for reasons of clarity, the invention is described using the example of a grounded supply voltage. However, the invention can also be applied to ungrounded (floating) power supply unit concepts. Use in grounded full bridges (grounded bridge) or floating amplifiers is therefore also possible.

The invention is shown using an amplifier with an analog audio input. However, it is irrelevant to the invention whether the audio signal is supplied to the amplifier in an analog form, a digital form or in another manner.

The calculated output voltage ("rail-up generation" functional block) can either be compared with a fixed threshold or the threshold can be dynamically changed during operation. An advantageous variant is that the threshold is tracked on the basis of the actual voltage of the low supply voltage +/–LOW RAIL. This means that, in practice, the switching-up is carried out neither too early (generates unnecessary high power loss) nor too late (results in distortion).

In the case of amplifiers with a bipolar supply voltage, it is also possible for only the respectively required operating voltage side to be switched up. It is therefore possible to switch two switches (positive branch and negative branch) with a temporal offset, rather than at the same time.

The invention can be applied either to one of the alternatives mentioned above or to any desired combination of the alternatives mentioned above (for example grounded full bridge with unipolar supply voltage).

BRIEF DESCRIPTION OF THE DRAWINGS

Further features, effects and advantages of the invention emerge from the following description of a preferred exemplary embodiment of the invention and from the accompanying figures in which, in a schematic basic sketch.

DETAILED DESCRIPTION

Figure 1:
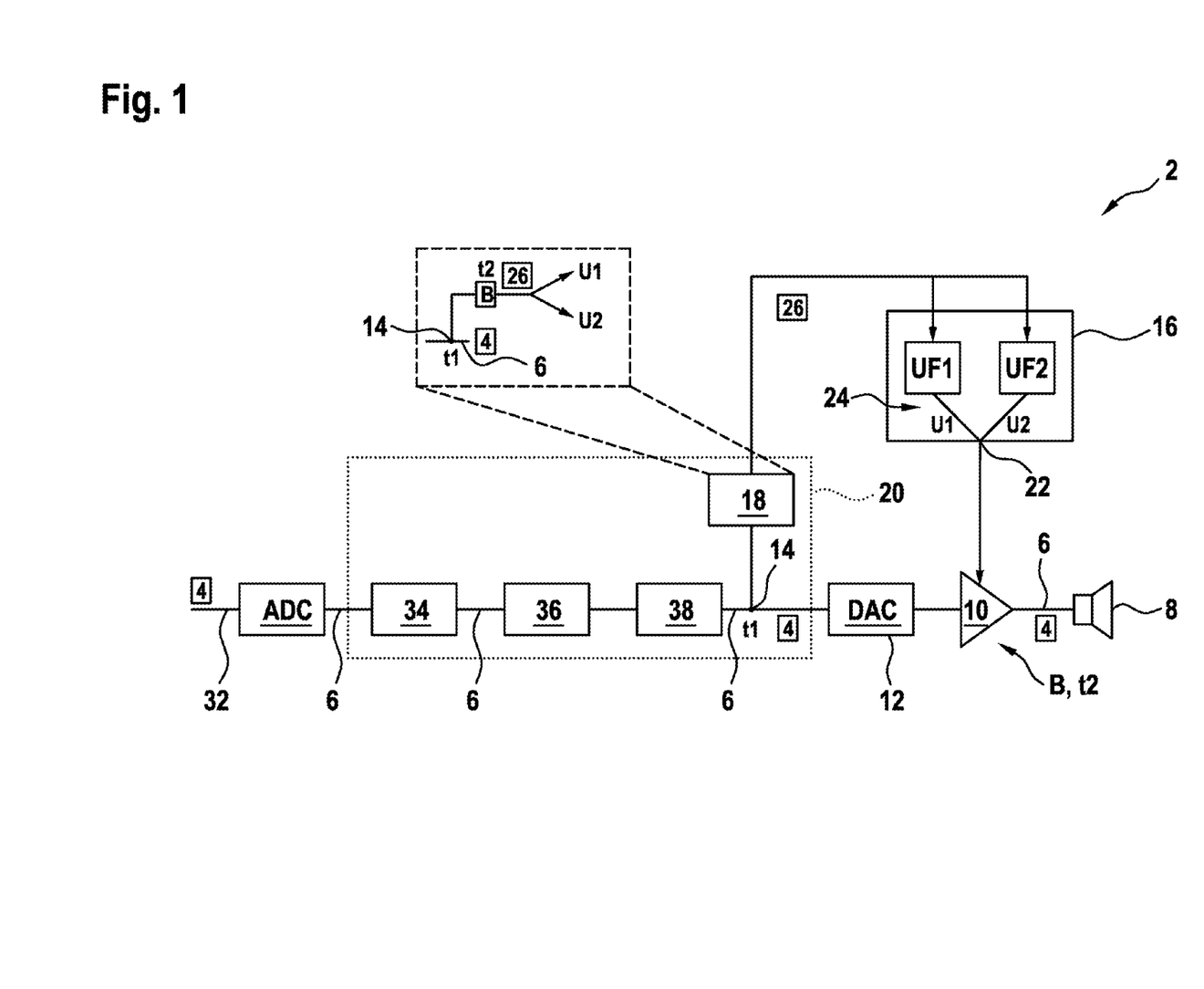
FIG. 1 shows an amplifier according to the invention.

FIG. 1 shows a class-D amplifier 2 for (digitally processing and) amplifying an audio signal 4. The amplifier 2 contains a signal path 6 on which the audio signal 4 runs through the amplifier 2 from the unprocessed unamplified state to the amplified processed state before it is output at a loudspeaker 8. In the signal path 6, the amplifier 2 contains an output stage 10 which is used for the actual power amplification of the audio signal 4. A digital signal processing unit 12, here a digital/analog converter (DAC), is arranged upstream of the output stage in the signal path 6. A voltage U for supplying power to the output stage 10 is provided in the amplifier 2. In this case, the voltage U can assume two different magnitudes U1, U2. In this case, the voltage U is a bipolar voltage, the magnitude U1 is +/–20 volts and the magnitude U2 is +/–165 volts. The voltage U is provided by a voltage source 16. The voltage source 16 is therefore used to supply power to the output stage 10 with the voltage U. In the signal path 6, a measurement location 14 is situated upstream of the digital signal processing unit 12.

The amplifier 2 contains a control and evaluation unit 18. The latter is used to predictively determine a voltage requirement B from the audio signal 4 at the measurement location 14, that is to say for that signal section of the audio signal which is present at the measurement location 14 at the time t1. The voltage requirement B is determined predictively, that is to say the voltage requirement B is the voltage requirement subsequently required in the output stage 10 at a time t2, that is to say the necessary magnitude of the voltage U for the subsequent proper amplification of the relevant signal section of the audio signal 4 in the output stage 10.

The control and evaluation unit 18 is also set up to select a respective magnitude U1 or U2 of the voltage U in a manner following the predictively determined voltage requirement B, which magnitude is minimally sufficient for the voltage requirement B, and to apply this voltage U of the corresponding magnitude U1, 2 to the output stage 10 before the time at which the audio signal 4 is amplified. According to FIG. 1, the following method is therefore carried out:

The audio signal 4 is amplified in the amplifier 2. The voltage U having the two magnitudes U1, U2 is provided. A voltage requirement B required for the subsequent amplification of the audio signal (at the time t2) in the output stage 10 is predictively determined from the audio signal 4 at the measurement location 14 (at the time t1). A respective magnitude U1 or U2 of the voltage U is selected in a manner following this voltage requirement B, which magnitude is minimally sufficient for the voltage requirement B, and this voltage U or magnitude U1 or U2 is applied to the output stage 10 before the time at which the audio signal 4 is amplified (t2).

Specifically, a particular section or a particular point of the audio signal 4 therefore arrives at the measurement location 14 at a time t1 and is evaluated there. The evaluation is used to determine what voltage requirement will be needed by the output stage 10 at a time t2 if this section of the audio signal 4 arrives at the output stage 10 in order to be amplified there. In this respect, the determination is carried out predictively since it is already predicted at the time t1 what voltage requirement B the output stage 10 will have at the time t2. The time difference t2–t1 (minus a possible computing time for determining the voltage requirement B) therefore remains in order to bring the voltage U to the corresponding magnitude U1 or U2.

U1<U2. The magnitude U1 is therefore selected if the voltage requirement B is less than or equal to the magnitude U1. The magnitude U2 is selected if the voltage requirement B is greater than the magnitude U1. The transition between the voltages U1 and U2 is effected here with a maximum edge steepness of one volt per microsecond. Since the time difference t2–t1 corresponds to the processing time of the audio signal 4 in the digital signal processing unit 12 and is several 100 microseconds here, sufficient time remains to change back and forth or change over between the magnitudes U1, 2 as necessary with the given edge steepness, wherein the changeover is not carried out in a sudden manner here, but rather with the given maximum edge steepness.

In particular, the edge steepness is selected in such a manner that the time difference t2–t1 just suffices to change between the magnitudes U1 and U2 in the available time t2–t1.

Inside the voltage source 16, a separate fixed voltage UF1, 2 of the respective magnitude U1, 2 is permanently held for each of the magnitudes U1 and U2 of the voltage U, and the voltage U is generated by continuously changing over between the fixed voltages UF1, 2.

The signal path 6 also contains the following units which are not explained in any more detail in order in the downstream direction: analog/digital converter ADC, input processing 34, array control 36 and loudspeaker processing (speaker processing) 38. The last three components mentioned, together with the control and evaluation unit 18, also called "rail-up generation" here, are combined in a digital signal processor DSP 20. The loudspeaker processing 38 is also called "level controller" or can contain such a level controller.

Figure 2:
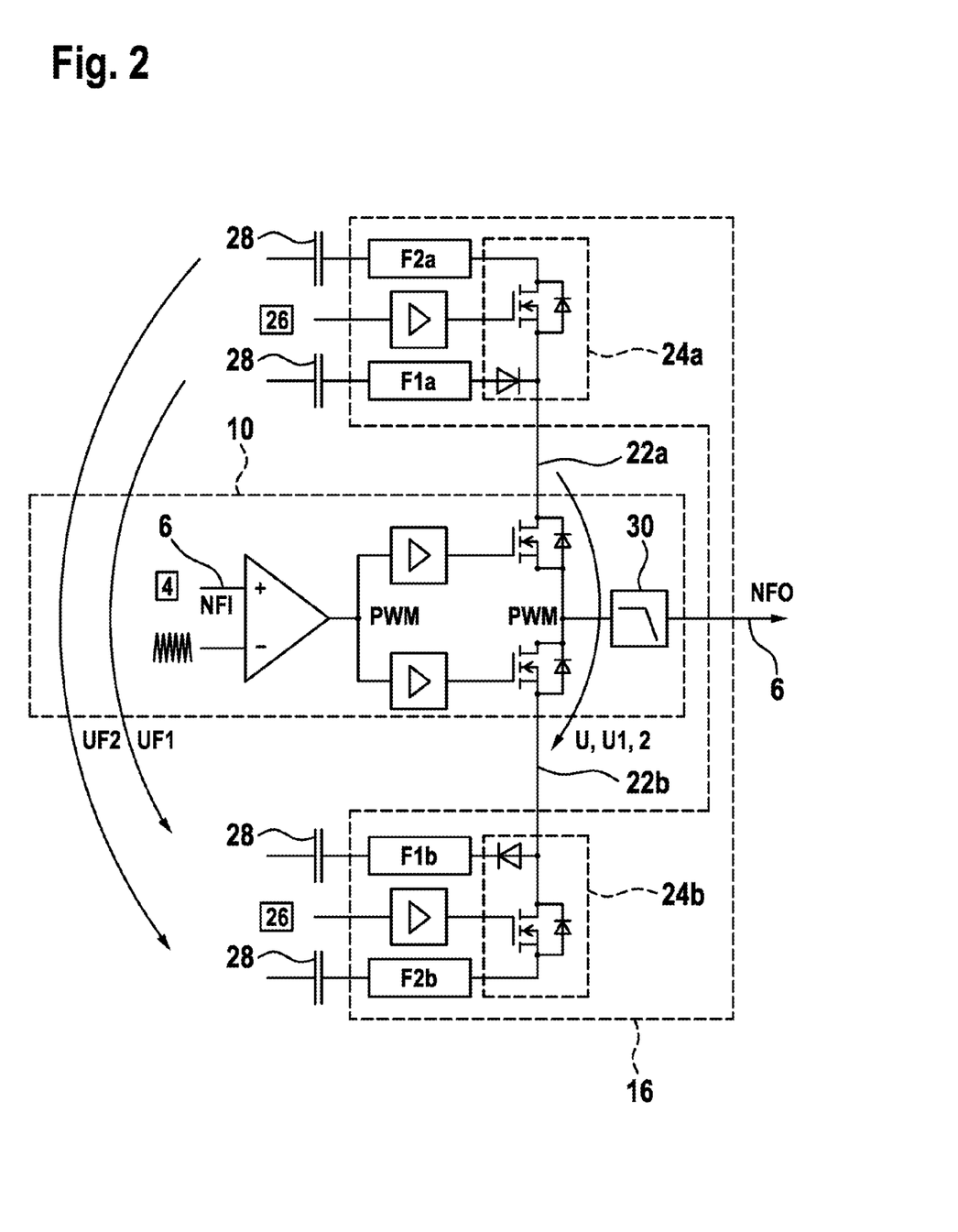
FIG. 2 shows the output stage and the voltage source from FIG. 1 in detail.

FIG. 2 shows the output stage 10 and the voltage source 16 from FIG. 1 in detail in each case. The voltage source 16 contains an output 22 which is divided into two partial outputs 22a, b for the respective upper potential (+) and lower potential (−) since the voltage source has a bipolar design here. The voltage source 16 is therefore a bipolar voltage source. For each magnitude U1, U2 of the voltage, the voltage source 16 has a fixed voltage input F1 and F2 which are here likewise each in the form of two partial inputs F1a, b and F2a, b on account of the bipolarity. The fixed voltage input F1a is referred to as "+low rail", F1b is referred to as "−low rail", F2a is referred to as "+high rail" and F2b is referred to as "−high rail".

The voltage source 16 contains two continuously switchable switching elements 24a, b which can be switched by a rail-up signal 26 generated by the control and evaluation unit 18.

Depending on the control by the rail-up signal 26, different fixed voltage inputs F1, 2 can therefore be selectively connected to the output 22. If the "high rail" is activated, the "low-rail" voltage is deactivated or protected thanks to a diode in the switching elements 24. The output 22 and fixed voltage inputs F1, 2 therefore each have the two poles mentioned (interface, connections). A switching element 24a, b is included for each pole of the output 22a, b.

The amplifier 2 contains buffer capacitors 28 (only symbolically indicated here) for the voltage U and the fixed voltages of the magnitudes U1, 2 only on those sides of the fixed voltage inputs F1, 2 which are remote from the output 22. Since the fixed voltages are always permanently held, these buffer capacitors are permanently charged and their charge is not reversed in any case by switching operations caused by the switching elements 24a, b.

In a conventional manner which is not explained in any more detail, the output stage 10 contains a low-frequency input NFI and uses the latter to generate a PWM signal PWM which is amplified and is passed to a low-frequency output NFO via a low-pass filter 30.

FIG. 2 therefore shows a possible schematic form of implementation of a class-D amplifier with switchable operating voltages. A class-D half-bridge (output stage 10) which is fed with a bipolar supply voltage (voltage U) is shown in this case. The function of switching up the supply voltage (voltage U from magnitude U1 to magnitude U2) without reversing the charge of buffer capacitors is as follows:

A power supply unit (not illustrated) permanently provides the bipolar lower ("small") supply voltage+LOW RAIL (F1a) and −LOW RAIL (F1b) as well as the bipolar high (higher) supply voltage+HIGH RAIL (F2a) and −HIGH RAIL (F2b).

In the case of light use and at no load of the output stage 10, the class-D half-bridge (comprising the field effect transistors, which are illustrated but are not described in any more detail, and the reconstruction filter (low-pass filter 30)) is supplied with the low supply voltage U of the magnitude U1 via the diodes illustrated.

If the output stage 10 must provide a higher output voltage, that is to say the arriving part of the audio signal 4 requires a voltage requirement B of the voltage U greater than the magnitude U1 for its proper amplification, the RAIL_UP signal 26 is used to connect the switching elements 24a, b (likewise contain field effect transistors to be actually switched). The class-D half-bridge is therefore supplied with the higher supply voltage (voltage U of the magnitude U2: +HIGH RAIL and −HIGH RAIL).

The class-D half-bridge does not have any local buffer capacitors 28 which make a significant contribution to storing energy. Consequently, an increased charging current does not flow at the moment of switching up the supply voltage U. Consequently, no current pulses are produced on the mains supply (in particular in the power supply unit on the input side) as a result of the switching-up.

As already stated above, the supply voltage (magnitude U1 to magnitude U2) must be ramped up comparatively slowly in the case of class-D amplifiers so that audible artefacts are not produced at the output stage output (NFO or loudspeaker 8) at the switching-up moment. This technology is used here: the driver stages (FETs of the switching elements 24a, b) or switching signals (rail-up signal 26) for the switching elements 24a, b ensure a sufficiently slow rise in the operating voltage of the supply voltages from magnitude U1 to U2 by slowly connecting the field effect transistors (in the switching elements 24a, b) in a defined manner.

In order to now avoid the problem of non-linear distortion, as described above, the procedure is as follows: as will be stated further below, the RAIL-UP signal 26 is proactively or predictively generated. The slow ramping-up of the operating voltage (voltage U) from the magnitude U1 to the magnitude U2 is already started before the output stage 10 requires the high operating voltage (U2). As a result of this technology, the high voltage (U2) is available to the output stage 10 at the correct time t2 without resulting in audible changeover artefacts at the output stage output (NFO).

FIG. 1 shows the essential functional blocks of the signal flow inside a modern audio power amplifier 2 with a digital signal processing function (DSP 20). FIG. 1 therefore shows a signal flow diagram of an audio power amplifier with a digital processing function. The input signal (audio signal 4, unprocessed, unamplified) is supplied to the amplifier via the input (INPUT) 32. The signal is converted into a digital signal by means of the analog/digital converter ADC. Various signal processing operations are then carried out in the functional block DSP 20. The output of the functional block (or output of the loudspeaker processing 38—SPEAKER PROCESSING) is tapped off at the measurement location 14. The functional block RAIL_UP GENERATION (control and evaluation unit 18) uses this signal and calculates the output signal to be expected taking into account the gain of the output stage 10 (CLASS-D AMP). If the calculated output signal (potential amplified and processed audio signal 4 at the low-frequency output NFO) exceeds a defined threshold, the RAIL_UP signal 26 is generated and, as described above, initiates the comparatively slow ramping-up of the internal supply voltage.

The RAIL_UP signal 26 is therefore already present at a time t1 (delayed by computing time, see above) before the audio signal 4 reaches the actual amplifier (output stage 10) at the time t2 after passing through the digital/analog converter (DAC, signal processing unit 12). Commercially available digital/analog converters for audio applications usually have latencies of several 100 µs. While the audio signal 4 passes through the digital/analog converter DAC, the operating voltage is already ramped up from magnitude U1 to U2 if necessary in a parallel manner. The higher operating voltage of the magnitude U2 is therefore available to the class-D amplifier (output stage 10) at the correct time t2 (arrival of the audio signal 4 or signal section evaluated at the measurement location 14) without resulting in undesirable secondary effects.

Figure 3:
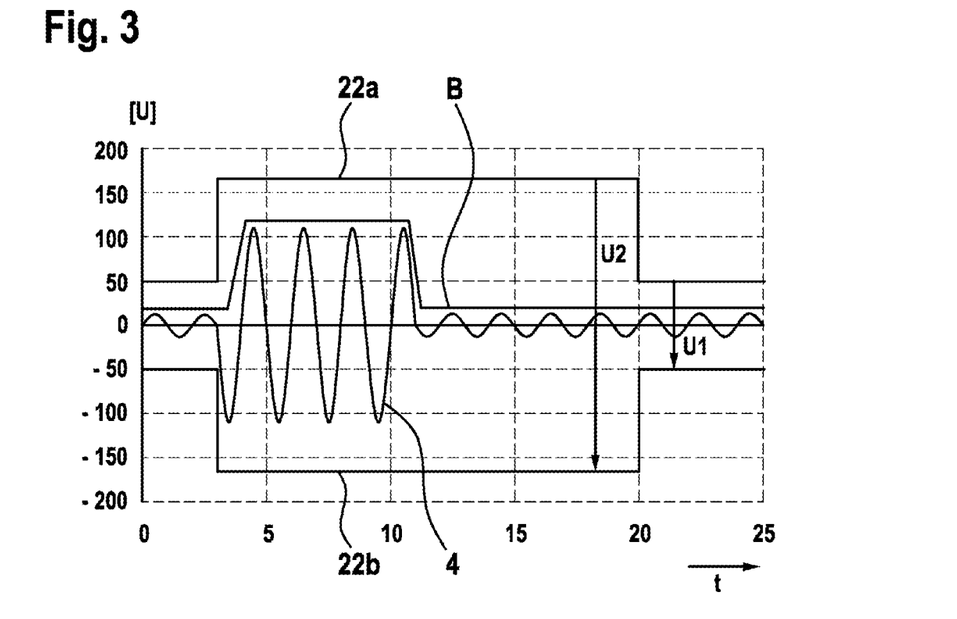
FIG. 3 shows a temporal profile of signals for comparatively rare changeover of the voltage magnitude.

FIG. 3 shows the audio signal 4 and the respectively determined voltage requirement B for each time of the signal over the time T in milliseconds and the profile of the voltage U or of the potentials at the outputs 22a, b in the case of comparatively slow switching. FIG. 3 shows a schematic illustration for the implementation of rare switching. Potentials ([U]) of the outputs 22a, b over the time t are plotted only for qualitative explanation.

Figure 4:
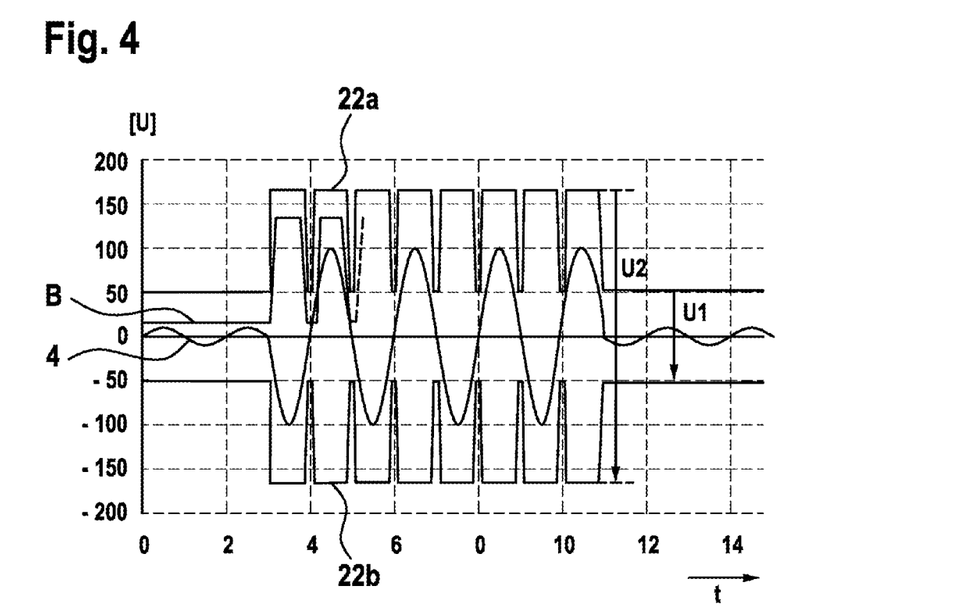
FIG. 4 shows a comparable temporal profile for comparatively frequent changeover.

FIG. 4 shows corresponding operations for fast switching, wherein the corresponding requirement B is followed very quickly in each case. Overall, a greater energy saving results according to FIG. 4 than according to FIG. 3. FIG. 4 therefore shows the schematic illustration for the implementation of frequent switching. The illustration corresponds to FIG. 3.

The invention claimed is:

1. A method for operating a class-D amplifier (2) for amplifying an audio signal (4), wherein the amplifier (2) contains an output stage (10) and a digital signal processing unit (12) arranged upstream of the output stage (10) in a signal path (6) for the audio signal (4), in which:
   a voltage (U) of at least two different magnitudes (U1, U2) is provided for the purpose of supplying power to the output stage (10),
   a voltage requirement (B) of the output stage (10), which is needed to subsequently amplify the audio signal in the output stage (10), that is predictively determined from the audio signal (4) at a measurement location (14) in the signal path (6) upstream of the signal processing unit (12),
   a respective magnitude (U1, U2) of the voltage (U) is selected in a manner following the predictively determined voltage requirement (B), which magnitude is minimally sufficient for the voltage requirement (B), and is applied to the output stage (10) before the time (t2) at which the audio signal (4) is amplified
   wherein the voltage source (16) has an output (22) for the voltage (U) and has a fixed voltage input (F1, 2) for each magnitude (U1, U2) of the voltage (U) and contains at least one continuously switchable switching element (24a, b) in order to selectively connect different fixed voltage inputs (F1, 2) to the output (22).

2. The method as claimed in claim 1, characterized in that the voltage (U) at the output stage (10) is increased and/or reduced between the different magnitudes (U1, U2) with a maximum edge steepness of 5 V/µs.

3. The method as claimed in claim 1, characterized in that the edge steepness is selected in such a manner that a time difference (t2−t1) between the predictive determination of the voltage requirement (B) for the audio signal (4) and its subsequent amplification in the output stage (10) just suffices for the change in the magnitude (U1, U2) of the voltage (U).

4. The method as claimed in claim 1, characterized in that, for each magnitude (U1, U2) of the voltage (U), a separate fixed voltage (UF1, 2) of this magnitude (U1, U2) is permanently held and the voltage (U) is generated by continuously changing over between the fixed voltages (UF1, 2).

5. A class-D amplifier (2) for amplifying an audio signal (4), wherein the amplifier (2) comprising:
   an output stage (10),
   a digital signal processing unit (12) arranged upstream of the output stage (10) in a signal path (6) for the audio signal (4),
   a voltage source (16) for supplying power to the output stage (10) with a voltage (U) of at least two different magnitudes (U1, U2),
   a measurement location (14) arranged upstream of the signal processing unit (12) in the signal path (6),
   a control and evaluation unit (18) for predictively determining a voltage requirement (B) from the audio signal (4) at the measurement location (14),
   wherein the voltage requirement (B) is the voltage requirement (B) subsequently required in the output stage (10) for the subsequent proper amplification of the audio signal (4) in the output stage (10),
   wherein the control and evaluation unit (18) is also set up to select a respective magnitude (U1, U2) of the voltage (U) in a manner following the predictively determined voltage requirement (B), which magnitude is minimally sufficient for the voltage requirement (B), and to apply said magnitude to the output stage before the time (t2) at which the audio signal (4) is amplified in the output stage (10)
   wherein the voltage source (16) has an output (22) for the voltage (U) and has a fixed voltage input (F1, 2) for each magnitude (U1, U2) of the voltage (U) and contains at least one continuously switchable switching element (24a, b) in order to selectively connect different fixed voltage inputs (F1, 2) to the output (22).

6. The amplifier (2) as claimed in claim 5, characterized in that the signal processing unit (12) contains a digital/analog converter (DAC).

7. The amplifier (2) as claimed in claim 6, characterized in that the signal processing unit (12) contains a level controller arranged upstream of the digital/analog converter (DAC).

8. The amplifier (2) as claimed in claim 5, characterized in that the voltage source (16) is a bipolar voltage source and the output (22) and each fixed voltage input (F1, 2) respectively have two poles (22a, b, F1a, b, F2a, b), and the voltage source (16) contains at least one switching element (24a, b) for each pole (22a, b) of the output (22).

9. The amplifier (2) as claimed in claim 5, characterized in that the voltage source (16) contains buffer capacitors (28) for the voltage (U) only on those sides of the fixed voltage inputs (F1, 2) which are remote from the output (22).

10. The amplifier (2) as claimed in claim 5, characterized in that the voltage source (16) contains buffer capacitors (28) for the fixed voltages (UF1, 2) only on those sides of the fixed voltage inputs (F1, 2) which are remote from the output (22).

11. The method as claimed in claim 1, characterized in that the voltage (U) at the output stage (10) is increased and/or reduced between the different magnitudes (U1, U2) with a maximum edge steepness of 3 V/μp.

12. The method as claimed in claim 1, characterized in that the voltage (U) at the output stage (10) is increased and/or reduced between the different magnitudes (U1, U2) with a maximum edge steepness of 1 V/μp.

13. The method as claimed in claim 1, characterized in that the voltage (U) at the output stage (10) is increased and/or reduced between the different magnitudes (U1, U2) with a maximum edge steepness of 0.5 V/μs.

14. The method as claimed in claim 1, characterized in that the voltage (U) at the output stage (10) is increased and/or reduced between the different magnitudes (U1, U2) with a maximum edge steepness of 0.25 V/μs s.

15. The method as claimed in claim 1, characterized in that the voltage (U) at the output stage (10) is increased and/or reduced between the different magnitudes (U1, U2) with a maximum edge steepness of 0.1 V/μs.

* * * * *